United States Patent
Yamakita

(10) Patent No.: US 9,226,432 B2
(45) Date of Patent: Dec. 29, 2015

(54) DISPLAY DEVICE

(75) Inventor: Hiroyuki Yamakita, Osaka (JP)

(73) Assignee: JOLED INC., Tokyo (JP)

( * ) Notice: Subject to any disclaimer, the term of this patent is extended or adjusted under 35 U.S.C. 154(b) by 183 days.

(21) Appl. No.: 14/131,699

(22) PCT Filed: Jul. 12, 2012

(86) PCT No.: PCT/JP2012/004524
§ 371 (c)(1),
(2), (4) Date: Jan. 9, 2014

(87) PCT Pub. No.: WO2013/008473
PCT Pub. Date: Jan. 17, 2013

(65) Prior Publication Data
US 2014/0160674 A1 Jun. 12, 2014

(30) Foreign Application Priority Data
Jul. 13, 2011 (JP) .................................. 2011-155114

(51) Int. Cl.
*H05K 7/20* (2006.01)
*G06F 1/20* (2006.01)
(Continued)

(52) U.S. Cl.
CPC .............. *H05K 7/20963* (2013.01); *G09F 9/00* (2013.01); *H01L 51/529* (2013.01)

(58) Field of Classification Search
CPC .......................... H05K 7/20963; H01L 51/529
See application file for complete search history.

(56) References Cited

U.S. PATENT DOCUMENTS

| 7,176,605 B2 * | 2/2007 | Bae ..................... H05K 7/20963 313/46 |
| 7,362,042 B2 * | 4/2008 | Bae ..................... H05K 7/20963 313/46 |
| 2006/0098412 A1 | 5/2006 | Kim et al. |

(Continued)

FOREIGN PATENT DOCUMENTS

| JP | 09-050241 | 2/1997 |
| JP | 2003-084677 | 3/2003 |

(Continued)

OTHER PUBLICATIONS

U.S. Appl. No. 14/131,440 to Kenichi Masumoto et al., filed Jan. 8, 2014.

(Continued)

*Primary Examiner* — Robert J Hoffberg
(74) *Attorney, Agent, or Firm* — Greenblum & Bernstein, P.L.C.

(57) ABSTRACT

The present application discloses a display device including a display panel for displaying images; a first thermal conduction layer including a flexible and compressively deformable portion in contact with the display panel, and a thermal conduction portion for conducting heat from the flexible portion; and a second thermal conduction layer in contact with the thermal conduction portion. The first thermal conduction layer conducts heat isotropically. The second thermal conduction layer with higher thermal conduction characteristics in an in-plane direction than the first thermal conduction layer forms a thermal conduction element with the thermal conduction portion. The thermal conduction element includes a first area corresponding to a center of the display panel and a second area closer to an edge of the display panel than the first area. The second area has higher thermal conductivity in the in-plane direction than the first area does.

14 Claims, 11 Drawing Sheets

(51) Int. Cl.
*G09F 9/00* (2006.01)
*H01L 51/52* (2006.01)

(56) References Cited

U.S. PATENT DOCUMENTS

| | | | | |
|---|---|---|---|---|
| 2006/0152905 A1* | 7/2006 | Kim | ................ | H05K 5/02 361/715 |
| 2008/0186419 A1* | 8/2008 | Kim | ................ | H05K 7/20963 349/32 |
| 2009/0126903 A1* | 5/2009 | Kuibira | ................ | H05K 7/20963 165/67 |
| 2009/0291609 A1* | 11/2009 | Kim | ................ | H05K 7/20963 445/24 |
| 2010/0244005 A1 | 9/2010 | Gyoda | | |

FOREIGN PATENT DOCUMENTS

| | | |
|---|---|---|
| JP | 2005-229100 | 8/2005 |
| JP | 2005-292310 | 10/2005 |
| JP | 2006-139262 | 6/2006 |
| JP | 2008-197429 | 8/2008 |
| JP | 2009-087626 | 4/2009 |
| JP | 2010-072205 | 4/2010 |
| JP | 2010-231979 | 10/2010 |
| JP | 2011-039119 | 2/2011 |
| JP | 2011-113704 | 6/2011 |

OTHER PUBLICATIONS

Search report from International Search Report in PCT/JP2012/004524, mail date is Oct. 16, 2012.

* cited by examiner

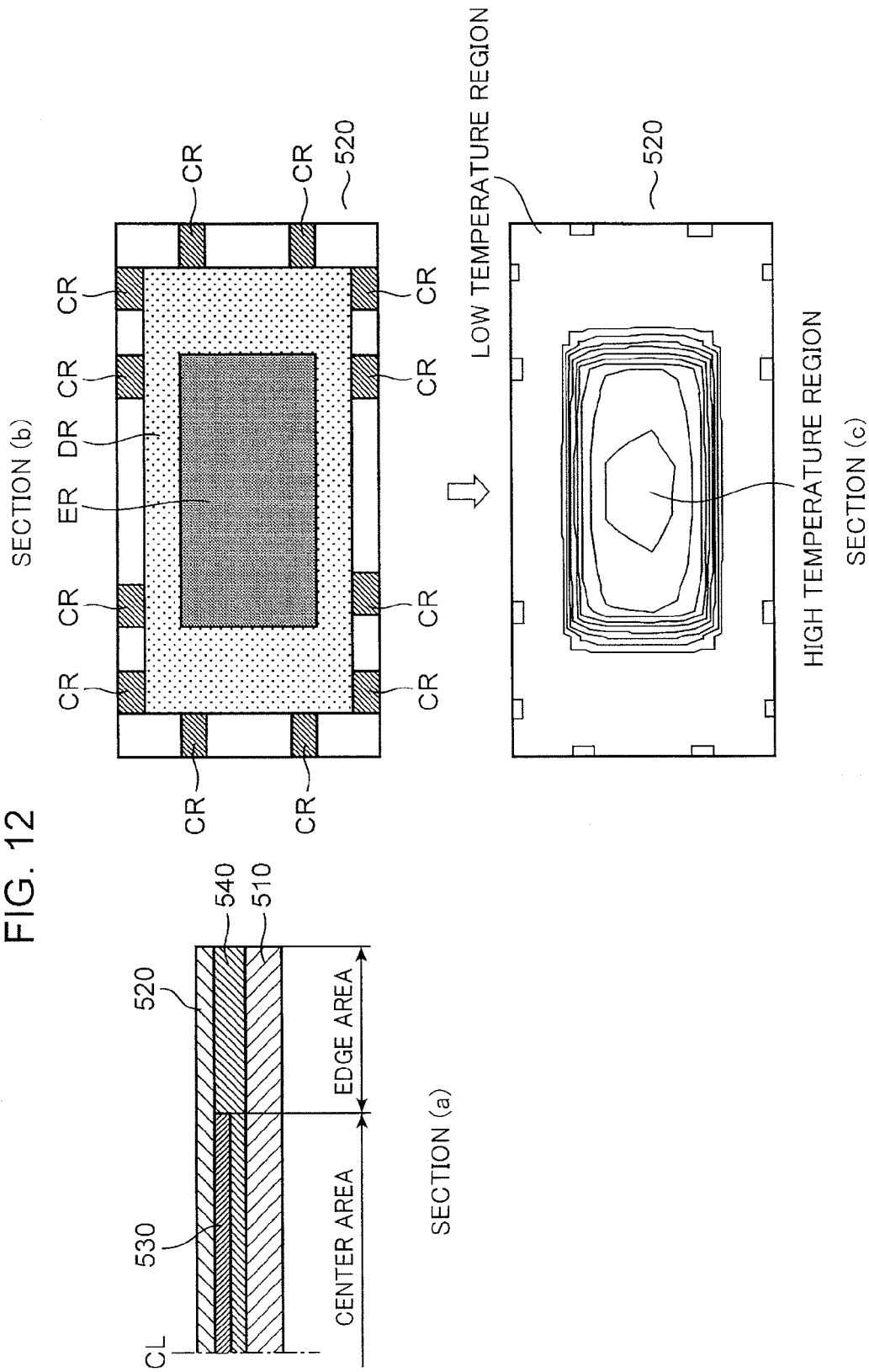

DISPLAY DEVICE

TECHNICAL FIELD

The present invention relates to a display device configured to display images.

BACKGROUND ART

A display device in general includes a display panel configured to display images. The display panel typically includes luminous elements configured to emit light in response to image signals input to the display device. The luminous elements generate heat in synchronization with light emission to represent images. The heat from the luminous elements is likely to be confined inside the display panel. If there is a temperature rise inside the display panel, normal operations of the display panel are often interrupted.

The display device may be exemplified by an organic EL (electroluminescence) display. The organic EL display includes organic EL elements. A luminous layer of an organic EL element is likely to be susceptible to heat. Therefore, a life of a display panel is shortened under an excessive temperature rise inside the display panel.

In order to facilitate heat dissipation from a display panel, it has been considered to install a radiator on the rear surface of the display panel. If a radiator installed on the display panel appropriately radiates heat from the display panel to the outside, an excessive temperature rise is less likely to happen to the display panel.

However, there is not appropriate transfer of heat generated by light emission to the radiator actually because of a low contact level between the display panel and the radiator. Consequently, heat is accumulated inside the display panel to cause a temperature rise of the display panel. Therefore, the luminous layer is likely to deteriorate.

Patent Document 1 discloses a radiation sheet, which is a lamination of an expanded graphite sheet and a net formed of metal wires. The expanded graphite sheet and the net are integrated under a rolling process. If such a radiation sheet is attached to a substrate on which semiconductors of electronic equipment are mounted, heat generated by the semiconductors on the substrate may be transferred to a heat sink through the radiation sheet.

Even if the radiation sheet of Patent Document 1 is used for heat dissipation of a display panel, there may be insufficient heat dissipation effect. Thermal conductivity in the in-plane direction of the radiation sheet as an integrated lamination of the expanded graphite sheet and the net by a rolling process is constant, independent from a position of the radiation sheet. Therefore, unless heat generated at an edge of the display panel is radiated during heat generation in the center area of the display panel, little heat dissipates in the center area of the display panel. Consequently, the heat is confined to the center area of the display panel to cause a local temperature rise. Therefore, even if a conventional radiation sheet is used for a display panel, there is a temperature rise in the center area of the display panel to facilitate deterioration of organic EL elements situated in the center area of the display panel. This results in a drop in brightness in the center area of the display panel. A user watching (observing) a video displayed on the display panel is more likely to pay attention on images in the center area rather than images near the periphery of the display panel. Consequently, a drop in brightness in the center area of the display panel dramatically degrades quality of the video displayed by the display panel.

Patent Document 1: JP 2005-229100 A

SUMMARY OF THE INVENTION

It is an object of the present invention to provide a display device which may suppress a drop in brightness caused by a local temperature rise in the center area of the display panel.

A display device according to one aspect of the present invention includes: a display panel configured to display images; a first thermal conduction layer including a flexible portion, which is compressively deformable and in contact with the display panel, and a thermal conduction portion configured to conduct heat from the flexible portion; and a second thermal conduction layer in contact with the thermal conduction portion. The first thermal conduction layer conducts heat isotropically. The second thermal conduction layer, which has higher thermal conduction characteristics in the in-plane direction than the first thermal conduction layer does, forms a thermal conduction element together with the thermal conduction portion. The thermal conduction element includes a first area corresponding to a center of the display panel and a second area which is closer to an edge of the display panel than the center area is. The second area has higher thermal conductivity in the in-plane direction than the first area does.

The display device according to the present invention may suppress a drop in brightness caused by a local temperature rise in the center area of the display panel.

The objects, features and advantages of the present invention will become more apparent upon reading the following detailed description along with the accompanying drawings.

BRIEF DESCRIPTION OF THE DRAWINGS

FIG. 12 shows a simulation result about a temperature distribution.

DETAILED DESCRIPTION

Figure 1:
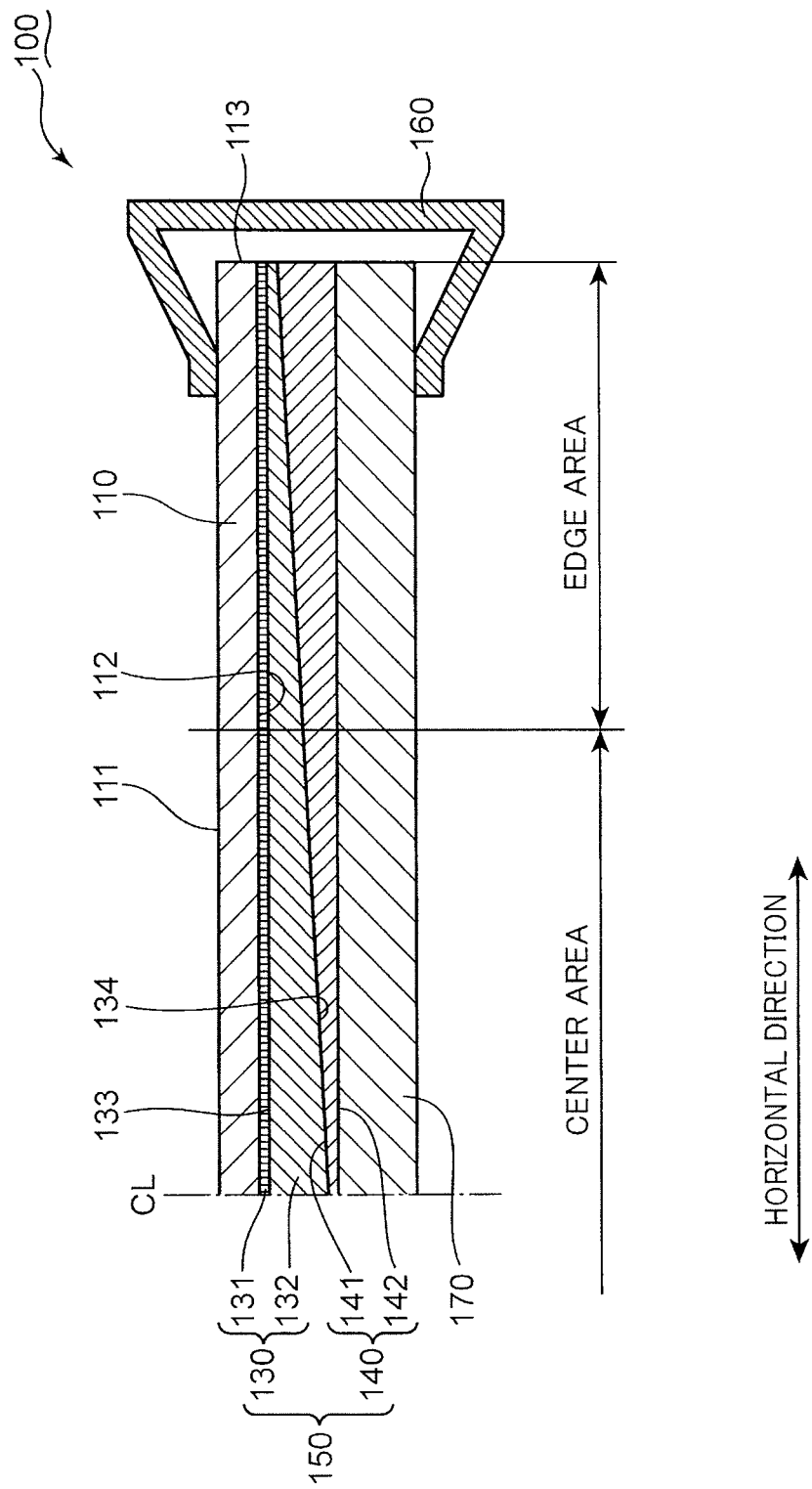
FIG. 1 is a schematic cross-sectional view of a display device according to the first embodiment.

Display devices according to various embodiments are described with reference to the drawings. In the following embodiments, the same components are denoted with the same reference symbols. To simplify description, redundant explanations are omitted as appropriate. Configurations, arrangements and shapes shown in the drawings, and the description about the drawings are merely intended to make principles of the display device easily understood. Therefore, the principles of the display device are not restricted thereby in any way.

Structure of Display Device

First Embodiment

Figure 2:
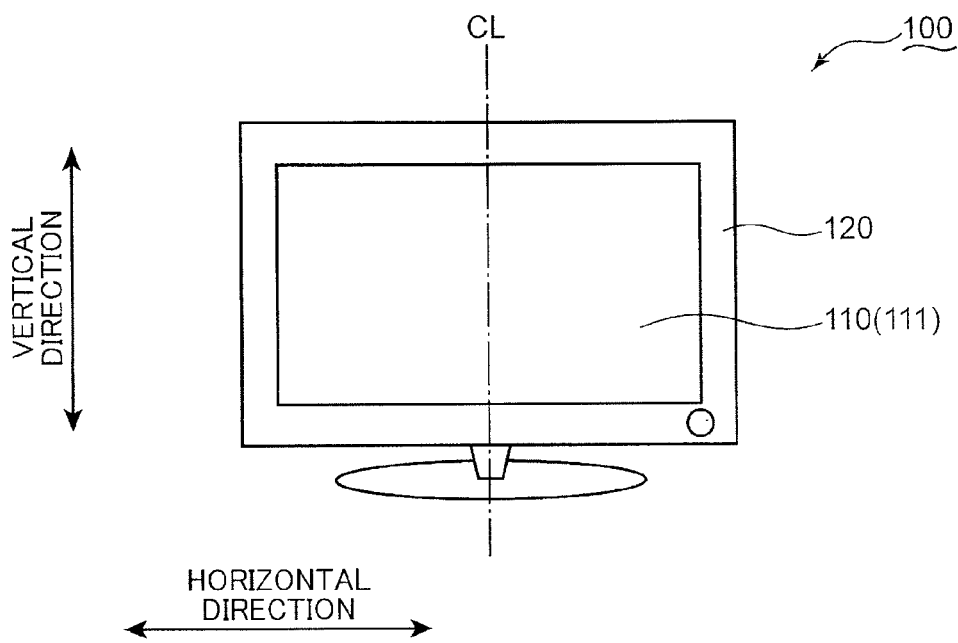
FIG. 2 is a schematic front view of the display device according to the first embodiment.

FIG. 1 is a schematic cross-sectional view of the display device 100 according to the first embodiment. FIG. 2 is a schematic front view of the display device 100 according to the first embodiment. The display device 100 is described with reference to FIGS. 1 and 2.

The display device 100 includes a display panel 110 configured to display images, and a housing 120 configured to support the display panel 110. The following various elements are stored in the housing 120.

In this embodiment, the display device 100 is used as a TV set. Alternatively, the display device 100 may be a display of a personal computer, a display of a portable telephone, a touch panel type information processor, or another device configured to display images.

In this embodiment, the display panel 110 is an organic EL display panel in which organic EL elements configured to emit light under current supply is incorporated. Alternatively, the display panel 110 may be a liquid crystal display panel, a plasma display panel, or another panel device configured to display images.

FIG. 1 is a schematic horizontal cross-sectional view of the display panel 110 and various elements connected to the display panel 110 in the right area of the center line CL depicted in FIG. 2 (the vertical line passing through the center of the display panel 110). Horizontal cross-sectional shapes of various elements of the display device 100 and horizontal thermal conduction principles are explained in the following description. These descriptions may be applicable to vertical cross-sectional shapes and vertical thermal conduction. It is preferable to apply the following thermal conduction principles to a direction where there is a longer distance from the center area of the display panel 110 to the periphery of the display panel 110.

As shown in FIG. 1, the display panel 110 includes a display surface 111, in which images are displayed, and a mounting surface 112 opposite to the display surface 111. Various elements (described below) to transfer heat generated inside the display panel 110 in the horizontal direction are mounted on the mounting surface 112.

The display device 100 further includes a first thermal conduction layer 130 which is mounted on the mounting surface 112. The first thermal conduction layer 130 includes a flexible portion 131, which is directly in contact with the mounting surface 112, and a thermal conduction plate 132, which holds the flexible portion 131 between the thermal conduction plate 132 and the mounting surface 112. The flexible portion 131 held between the mounting surface 112 and the thermal conduction plate 132 is compressively deformed and suitably contacts with the mounting surface 112. Therefore, heat generated inside the display panel 110 is suitably transferred to the flexible portion 131. The heat transferred to the flexible portion 131 is then conducted to the thermal conduction plate 132.

The flexible portion 131 and the thermal conduction plate 132 isotropically conduct heat. Therefore, the heat transferred from the display panel 110 to the flexible portion 131 spreads isotropically. The first thermal conduction layer 130 is formed from metal such as aluminum or copper or other materials with high thermal conductivity. In this embodiment, the thermal conduction portion is exemplified by the thermal conduction plate 132.

The thermal conduction plate 132 includes a pressing surface 133, which presses the flexible portion 131, and a first inclined surface 134 opposite to the pressing surface 133. The pressing surface 133 is approximately parallel with the mounting surface 112.

FIG. 1 shows a center area around the center line CL and an edge area which is closer to the right edge 113 of the display panel 110 than the center area is. The first thermal conduction layer 130 becomes gradually thinner from the center area to the edge area along with an inclination of the first inclined surface 134 of the thermal conduction plate 132. In this embodiment, the first area is exemplified by the center area. The second area is exemplified by the edge area.

The display device 100 further includes a second thermal conduction layer 140, which includes a second inclined surface 141 in contact with the first inclined surface 134 of the thermal conduction plate 132, and an installation surface 142 opposite to the second inclined surface 141. The second inclined surface 141 of the second thermal conduction layer 140 has approximately the same slope angle as the first inclined surface 134 of the thermal conduction plate 132 does whereas the slope direction of the second inclined surface 141 is opposite to the slope direction of the first inclined surface 134. Therefore, the second thermal conduction layer 140 becomes gradually thicker from the center area to the edge area. The installation surface 142 is approximately parallel with the mounting surface 112 of the display panel 110.

The second thermal conduction layer 140 has higher thermal conductivity in the in-plane direction than the first thermal conduction layer 130 does. For example, the second thermal conduction layer 140 may be formed from a graphite sheet.

As described above, since the first thermal conduction layer 130 conducts heat isotropically, heat of the display panel 110 is quickly conducted toward the second inclined surface 141 (i.e. in a direction away from the display panel 110). Then, the heat is horizontally conducted by the second thermal conduction layer 140. In this embodiment, the thermal conduction plate 132 and the second thermal conduction layer 140 are used as the thermal conduction element 150 to facilitate heat dissipation from the display panel 110.

As described above, the second thermal conduction layer 140 with high thermal conductivity in the in-plane direction is thicker in the edge area than the center area. Therefore, thermal conductivity of the thermal conduction element 150 in the in-plane direction is higher in the edge area than the center area. The high thermal conductivity of the thermal conduction element 150 in the edge area facilitates radiation from the edge area. Consequently, heat generated in the center area of the display panel 110 is more easily transferred to the edge area without confinement.

There is an increased contact area between the first and second thermal conduction layers 130, 140 since the first and second inclined surfaces 134, 141 are inclined. Therefore, heat is effectively transferred from the first thermal conduction layer 130 to the second thermal conduction layer 140.

The display device 100 further includes a heat sink 170, which is installed on the installation surface 142 of the second thermal conduction layer 140, and a clamp 160 configured to clamp the heat sink 170 and the display panel 110. The heat sink 170 is used not only for facilitating radiation of heat transferred to the second thermal conduction layer 140 but also for transferring a compressive force of the first thermal conduction layer 130 to the flexible portion 131. Therefore, the heat sink 170 is formed from a hard material with high thermal conductivity, such as a copper plate and an aluminum plate. The clamp 160 causes a compressive force between the display panel 110 and the heat sink 170. Therefore, the first and second thermal conduction layers 130, 140 are appropriately held between the display panel 110 and the heat sink 170. In addition, the flexible portion 131 of the first thermal conduction layer 130 is compressively deformed. Accordingly, heat is efficiently transferred from the display panel 110 to the first thermal conduction layer 130. In this embodiment, the compressing element is exemplified by the heat sink 170 and the clamp 160. The spring member is exemplified by the clamp 160. Another element configured to appropriately hold elements between the display panel and the heat sink and cause compressive deformation of the flexible portion may be used as the spring member, instead of the clamp 160.

Figure 3:
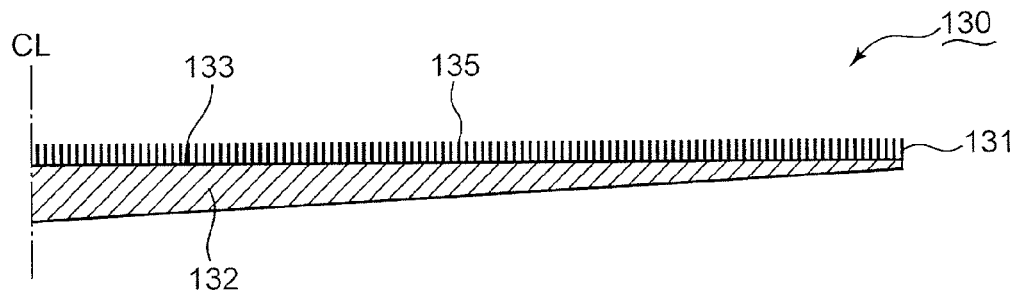
FIG. 3 is a schematic cross-sectional view of a first thermal conduction layer of the display device shown in FIG. 1.

FIG. 3 is a schematic cross-sectional view of the first thermal conduction layer 130. The first thermal conduction layer 130 is described with reference to FIGS. 1 and 3.

The flexible portion 131 includes a lot of needles (fibers) 135 standing from the pressing surface 133 of the thermal conduction plate 132. It is preferable that the needles 135 protruding toward the display panel 110 are integrated with thermal conduction plate 132. The needles 135 are given by a compressive force of the clamp 160 so that the flexible portion 131 is closely contacted with the display panel 110.

Second Embodiment

Figure 4:
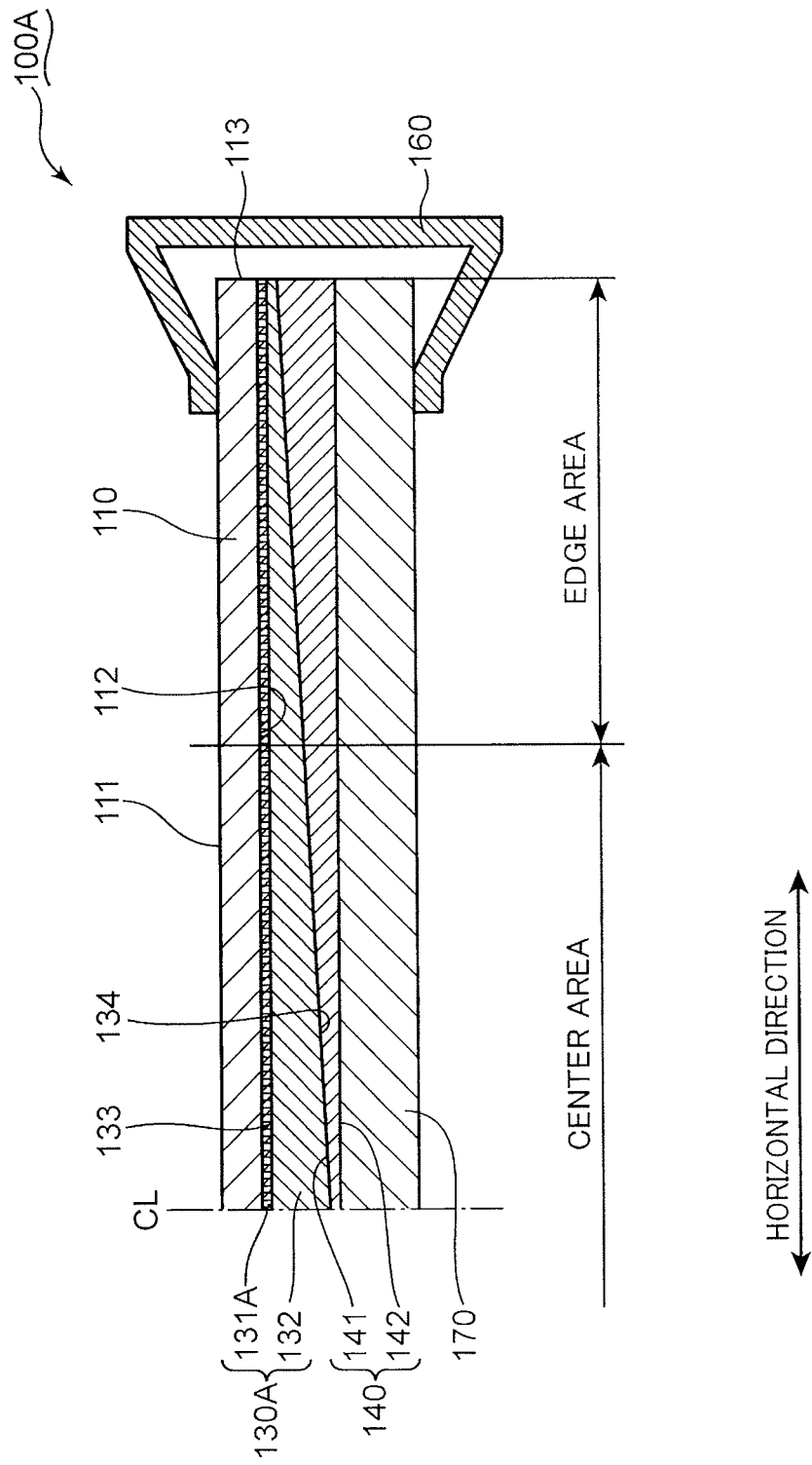
FIG. 4 is a schematic cross-sectional view of a display device according to the second embodiment.

FIG. 4 is a schematic cross-sectional view of the display device 100A according to the second embodiment. The display device 100A is described with reference to FIG. 4. The same components as those of the display device 100 according to the first embodiment are denoted with the same reference symbols. Description about the same components as the first embodiment is omitted. Only differences from the display device 100 according to the first embodiment are described.

Like the display device 100 described in the context of the first embodiment, the display device 100A includes the display panel 110, the second thermal conduction layer 140, the heat sink 170 and the clamp 160. The display device 100A further includes a first thermal conduction layer 130A mounted on the mounting surface 112 of the display panel 110. The first thermal conduction layer 130A includes a flexible portion 131A, which is directly in contact with the mounting surface 112, and a thermal conduction plate 132, which holds the flexible portion 131A between the thermal conduction plate 132 and the mounting surface 112. The thermal conduction plate 132 corresponds to the thermal conduction plate 132 of the first thermal conduction layer 130 described in the context of the first embodiment. The flexible portion 131A held between the mounting surface 112 and the thermal conduction plate 132 is compressively deformed and suitably contacts with the mounting surface 112. Therefore, heat generated inside the display panel 110 is suitably transferred to the flexible portion 131A. The heat transferred to the flexible portion 131A is then conducted to the thermal conduction plate 132.

Figure 5:
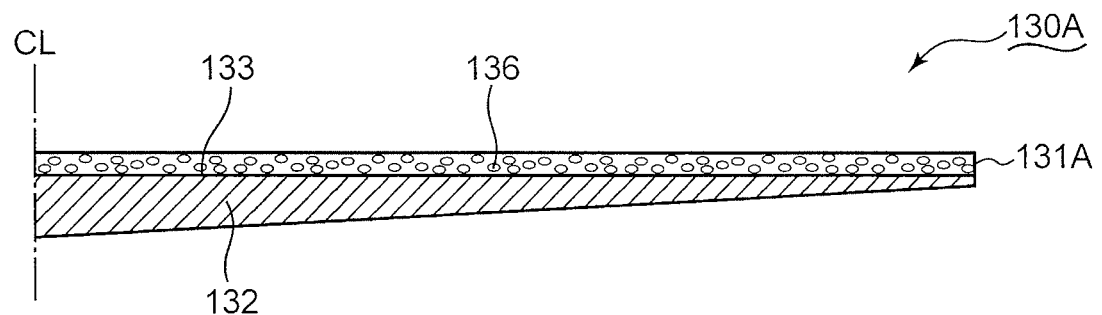
FIG. 5 is a schematic cross-sectional view of a first thermal conduction layer of the display device shown in FIG. 4.

FIG. 5 is a schematic cross-sectional view of the first thermal conduction layer 130A. The first thermal conduction layer 130A is described with reference to FIGS. 4 and 5.

The flexible portion 131A is a porous metal layer installed on the pressing surface 133 of the thermal conduction plate 132. For example, the flexible portion 131A is formed from metal with high thermal conductivity, such as aluminum or copper. Due to many holes 136 formed in the flexible portion 131A, the flexible portion 131A may be compressively deformed much more easily than a solid metal layer. Accordingly, the flexible portion 131A is compressed by a compressive force by the clamp 160 and closely contacts with the display panel 110.

Third Embodiment

Figure 6:
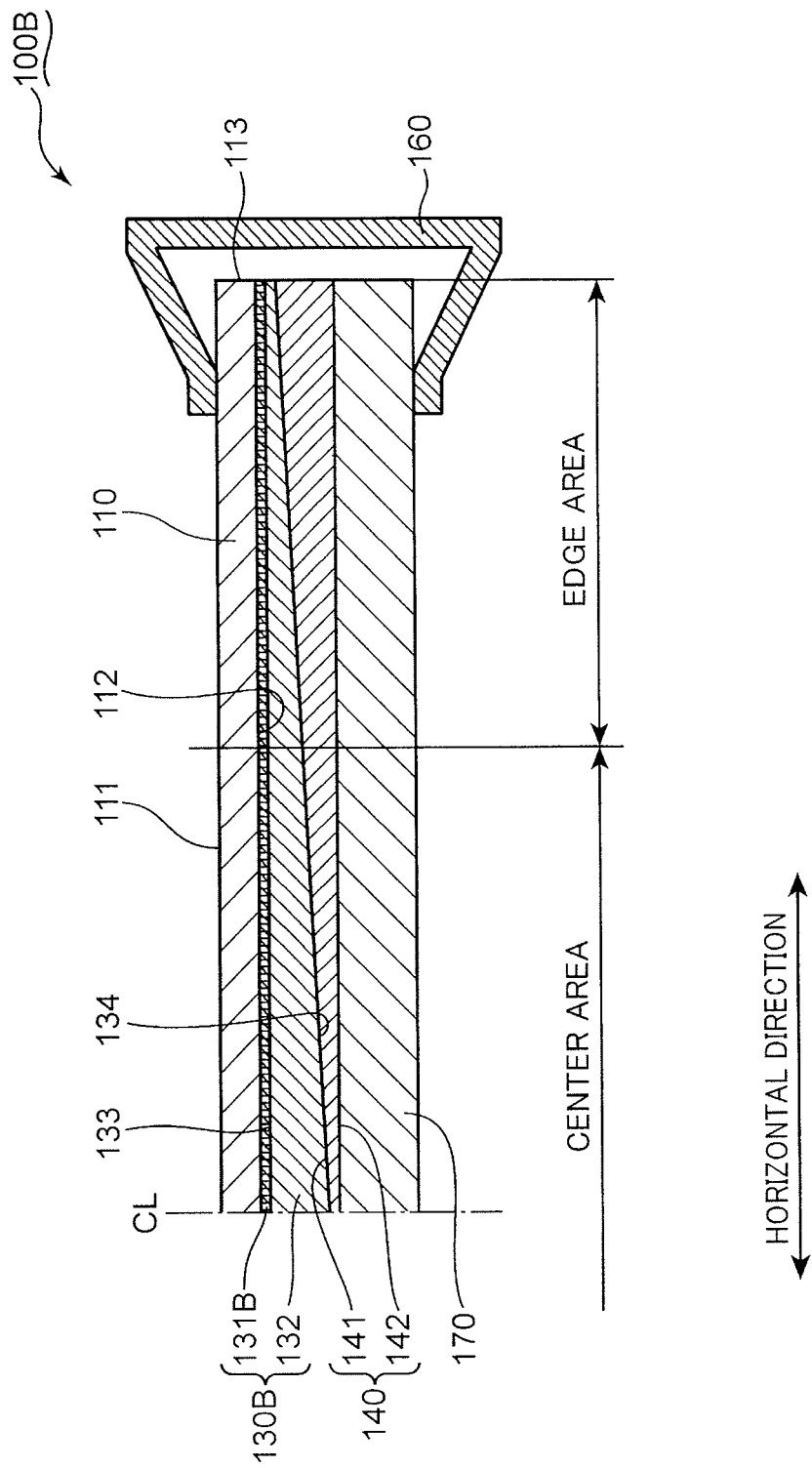
FIG. 6 is a schematic cross-sectional view of a display device according to the third embodiment.

FIG. 6 is a schematic cross-sectional view of the display device 100B according to the third embodiment. The display device 100B is described with reference to FIG. 6. The same components as those of the display device 100 according to the first embodiment are denoted with the same reference symbols. Description about the same components as the first embodiment is omitted. Only differences from the display device 100 according to the first embodiment are described.

Like the display device 100 described in the context of the first embodiment, the display device 100B includes the display panel 110, the second thermal conduction layer 140, the heat sink 170 and the clamp 160. The display device 100B further includes a first thermal conduction layer 130B mounted on the mounting surface 112 of the display panel 110. The first thermal conduction layer 130B includes a flexible portion 131B, which is directly in contact with the mounting surface 112, and a thermal conduction plate 132, which holds the flexible portion 131B between the thermal conduction plate 132 and the mounting surface 112. The thermal conduction plate 132 corresponds to the thermal conduction plate 132 of the first thermal conduction layer 130 described in the context of the first embodiment. The flexible portion 131B held between the mounting surface 112 and the thermal conduction plate 132 is compressively deformed and suitably contacts with the mounting surface 112. Therefore, heat generated inside the display panel 110 is suitably transferred to the flexible portion 131B. The heat transferred to the flexible portion 131B is then conducted to the thermal conduction plate 132.

Figure 7:
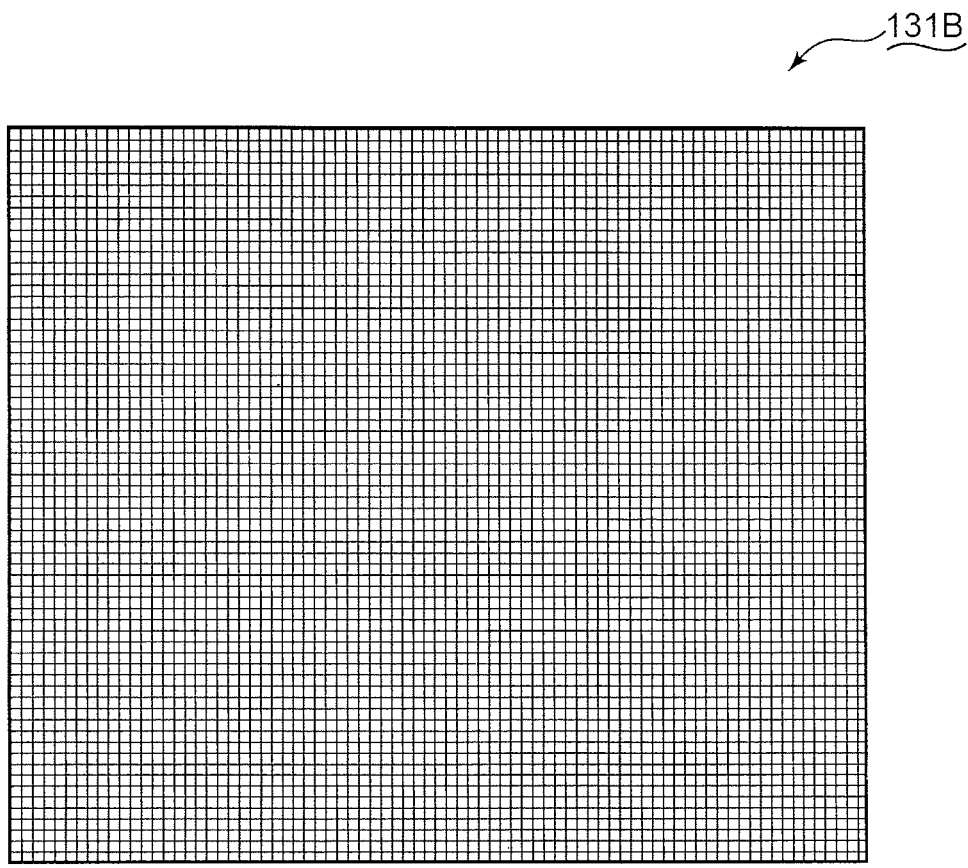
FIG. 7 is a schematic plan view of a part of a flexible portion of the display device shown in FIG. 6.

FIG. 7 is a schematic plan view of a part of the flexible portion 131B. The first thermal conduction layer 130B is described with reference to FIGS. 6 and 7.

The flexible portion 131B is a mesh sheet installed on the pressing surface 133. The mesh sheet is formed by weaving the wires of soft metal (e.g. copper, aluminum) into a sheet. Therefore, the flexible portion 131B is compressively deformed by a compressive force by the clamp 160, and closely contacts with the display panel 110.

Fourth Embodiment

In the first to third embodiments, the thickness of the first thermal conduction layer and the thickness of the second thermal conduction layer are gradually changed from the center area to the edge area to effectively cause thermal conduction in the horizontal direction. In the fourth embodiment, another structure to facilitate thermal conduction in the horizontal direction is described.

Figure 8:
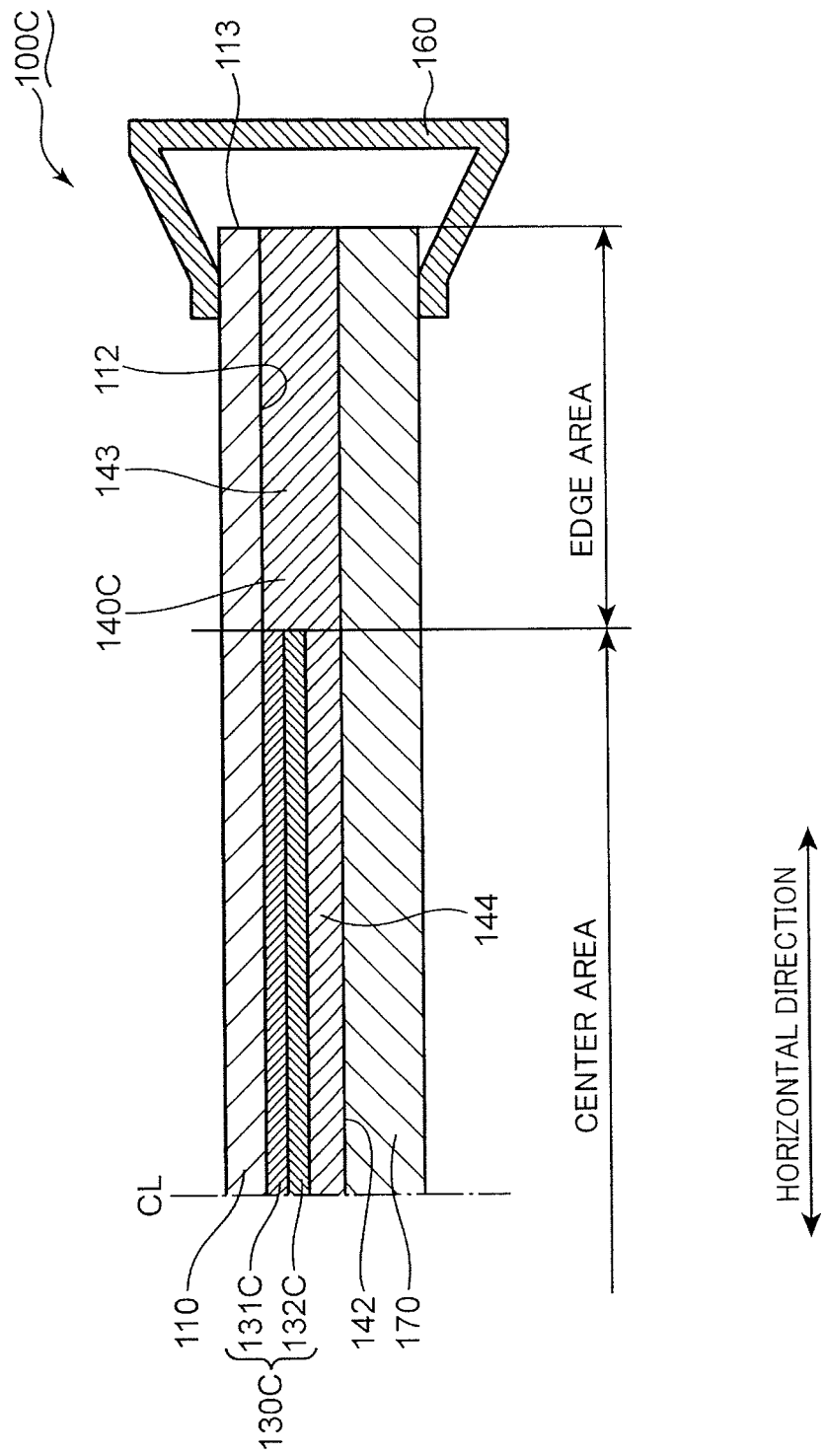
FIG. 8 is a schematic cross-sectional view of a display device according to the fourth embodiment.

FIG. 8 is a schematic cross-sectional view of the display device 100C according to the fourth embodiment. The display device 100C is described with reference to FIG. 8. The same components as those of the display device 100 according to the first embodiment are denoted with the same reference symbols. Description about the same components as the first embodiment is omitted. Only differences from the display device 100 according to the first embodiment are described.

Like the display device 100 described in the context of the first embodiment, the display device 100C includes the display panel 110, the heat sink 170 and the clamp 160.

FIG. 8 shows a center area around the center line CL and an edge area which is closer to the right edge 113 of the display panel 110 than the center area is. The display device 100C further includes a second thermal conduction layer 140C situated between heat sink 170 and the display panel 110. The second thermal conduction layer 140C includes a thick film portion 143 corresponding to the edge area and a thin film portion 144 corresponding to the center area. The thick film portion 143 is formed to be thicker than the thin film portion 144 is.

Like the second thermal conduction layer 140 described in the context of the first embodiment, the second thermal conduction layer 140C includes the approximately flat installation surface 142 on which the heat sink 170 is installed. Due to a difference in thickness between the thick and thin film portions 143, 144, a concave portion is formed on the surface (opposite to the installation surface 142) of the second thermal conduction layer 140C.

The display device 100C further includes a first thermal conduction layer 130C which is stored in the concave portion formed in the second thermal conduction layer 140C. The first thermal conduction layer 130C includes a thermal conduction plate 132C, which is installed on the thin film portion 144 of the second thermal conduction layer 140C, and a flexible portion 131C, which is situated between the thermal conduction plate 132C and the display panel 110. Unlike the first embodiment, a boundary of the thermal conduction plate 132C and the second thermal conduction layer 140C in the horizontal direction is approximately parallel with the mounting surface 112 of the display panel 110. The flexible portion 131C situated in the center area is closely contacted with the mounting surface 112 of the display panel 110, like the first embodiment. The flexible portion 131C may be the needles, the porous metal layer or the mesh sheet described in the context of the first to third embodiments. In this embodiment, the room is exemplified by the concave portion formed on the surface of the second thermal conduction layer 140C, which is opposite to the installation surface 142.

The first thermal conduction layer 130C is surrounded by the display panel 110 and the second thermal conduction layer 140C. Therefore, heat in the center area of the display panel 110 is transferred to the second thermal conduction layer 140C through the first thermal conduction layer 130C. The second thermal conduction layer 140C has higher thermal conductivity in the horizontal direction than the first thermal conduction layer 130C does. The thick film portion 143 of the second thermal conduction layer 140C may radiate more heat than the thin film portion 144 may. Accordingly, the heat is horizontally conducted effectively from the thin film portion 144 and the thick film portion 143 in contact with the peripheral surface of the first thermal conduction layer 130C.

Fifth Embodiment

Figure 9:
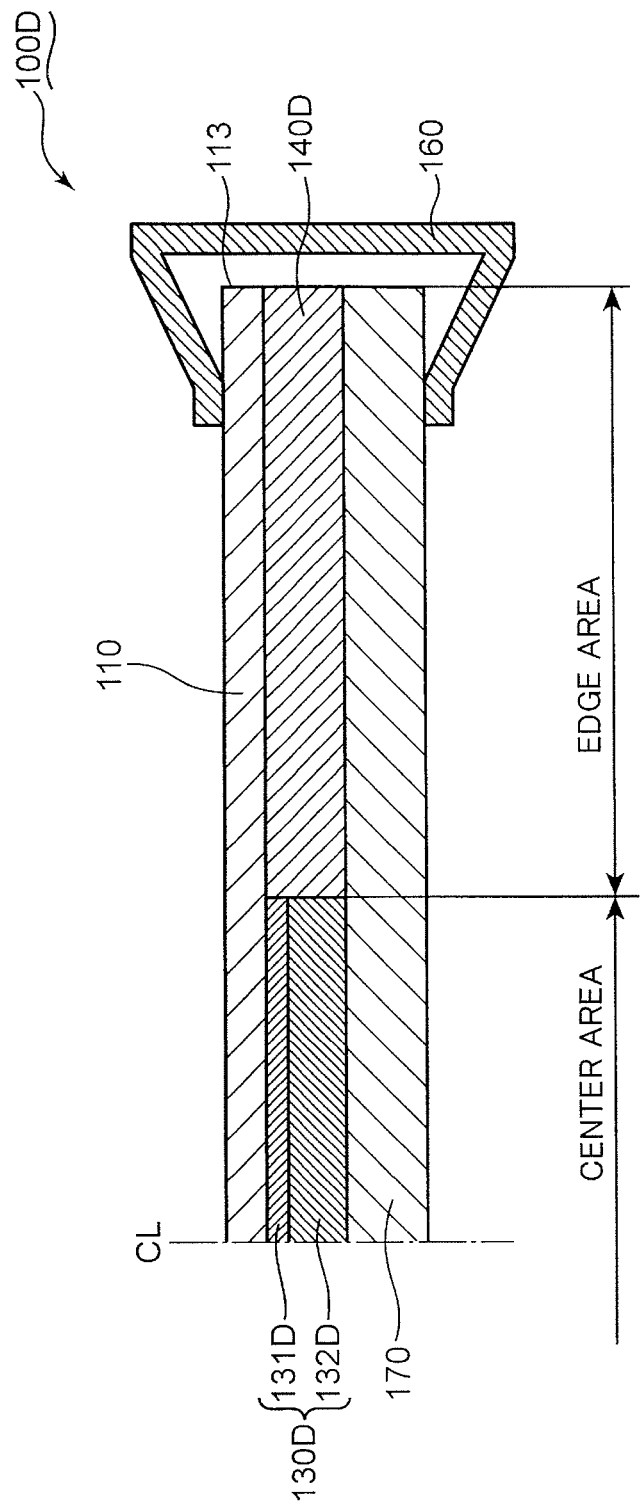
FIG. 9 is a schematic cross-sectional view of a display device according to the fifth embodiment.

FIG. 9 is a schematic cross-sectional view of the display device 100D according to the fifth embodiment. The display device 100D is described with reference to FIG. 9. The same components as those of the display device 100C according to the fourth embodiment are denoted with the same reference symbols. Description about the same components as the fourth embodiment is omitted. Only differences from the display device 100C according to the fourth embodiment are described.

Like the display device 100C described in the context of the fourth embodiment, the display device 100D includes the display panel 110, the heat sink 170 and the clamp 160.

The display device 100D further includes a first thermal conduction layer 130D and a second thermal conduction layer 140D situated between the heat sink 170 and the display panel 110. The second thermal conduction layer 140D is provided with an opening. The first thermal conduction layer 130D is situated in the opening formed in the second thermal conduction layer 140D. Therefore, the first thermal conduction layer 130D is surrounded by the second thermal conduction layer 140D. In this embodiment, the room is exemplified by the opening formed in the second thermal conduction layer 140D.

FIG. 9 shows a center area around the center line CL and an edge area which is closer to the right edge 113 of the display panel 110 than the center area is. The first thermal conduction layer 130D is situated in the center area. The second thermal conduction layer 140D is situated in the edge area.

The first thermal conduction layer 130D includes a thermal conduction plate 132D, which is directly in contact with the heat sink 170, and a flexible portion 131D situated between the thermal conduction plate 132D and the display panel 110. The flexible portion 131D may be the needles, the porous metal layer or the mesh sheet described in the context of the first to third embodiments.

The first thermal conduction layer 130D is directly compressed by the heat sink 170 and the display panel 110. Therefore, the flexible portion 131D is suitably compressed and closely contacts with the display panel 110. Consequently, heat in the display panel 110 is suitably transferred to the first thermal conduction layer 130D.

The heat transferred to the heat sink 170 through the boundary between the first thermal conduction layer 130D and the heat sink 170 spreads isotropically. Therefore, the heat in the center area of the display panel 110 is suitably radiated from the heat sink 170.

The second thermal conduction layer 140D has higher thermal conductivity in the horizontal direction than the first thermal conduction layer 130D does. Heat transferred to the second thermal conduction layer 140D through the boundary between the first and second thermal conduction layers 130D, 140D spreads horizontally. Therefore, the heat in the center area of the display panel 110 is suitably conducted toward the edge area.

(Physical Characteristics of Flexible Portion)

In the aforementioned embodiments, compressive deformation of the flexible portion causes suitable thermal conduction from the display panel to the first thermal conduction layer. Therefore, a relationship about rigidity between the display panel and the flexible portion is important. The relationship about the rigidity between the display panel and the flexible portion is described.

In the following description, the thickness of the display panel is denoted with the symbol "$t_1$". The Young's modulus of the display panel is denoted with the symbol "$E_1$". The thickness of the flexible portion is denoted with the symbol "$t_2$". The Young's modulus of the flexible portion is denoted with the symbol "$B_2$". If the relationship about the rigidity between the display panel and the flexible portion satisfies the following expression, compressive deformation of the flexible portion causes appropriate close contact of the first thermal conduction layer with the display panel.

$$(t_2^2 \times E_2) < (t_1^2 \times E_1) \quad \text{(Expression 1)}$$

If the relationship of Expression 1 is satisfied, the flexible portion is less rigid than the display panel is. Therefore, if a compressive force is applied to the display device, the flexible portion, not the display panel, is compressively deformed. Therefore, the first thermal conduction layer is closely contacted with the display panel.

The following expression expresses the ratio "a" of the rigidity of the flexible portion to the rigidity of the display panel.

$$a = (t_2^2 \times E_2)/(t_1^2 \times E_1) \quad \text{(Expression 2)}$$

If the ratio "a" expressed by Expression 2 is in a $10^{-4}$ to $10^{-3}$ range, the first thermal conduction layer is suitably contacted with the display panel.

The present inventor changed the ratio "a" to examine a contacting state of the first thermal conduction layer with the display panel.

An organic EL panel, of which thickness ($t_1$) was "1.4 mm", was prepared as a display panel. Most of the thickness of the organic EL panel was a thickness of a glass substrate. Therefore, the Young's modulus ($E_1$) of the organic EL panel was substantially regarded as the Young's modulus of soda float glass. Accordingly, the value "71.6 GPa" was used for the Young's modulus of the organic EL panel in order to calculate the ratio "a".

An aluminum sheet, of which thickness ($t_2$) was "50 μm", was used for the flexible portion. The Young's modulus ($E_2$) of the aluminum sheet was "70.3 GPa".

The ratio "a" acquired by using the aforementioned values was "$1.25 \times 10^{-3}$".

In this case, the aluminum sheet was closely contacted with the organic EL panel without gaps observed between the aluminum sheet and the organic EL panel. The heat generated under light emission from the organic EL panel was appropriately conducted to the thermal conduction plate through the aluminum sheet. It was confirmed that a temperature rise on a surface of the organic EL panel was small in comparison with a condition under usage a thick aluminum sheet (described below).

In order to compare with the aluminum sheet, which was "50 μm" in thickness ($t_2$), an aluminum sheet, of which thickness ($t_2$) is "0.5 mm", was prepared as the flexible portion. The ratio "a", which was calculated under this condition, was "$1.25 \times 10^{-1}$".

In this case, it was observed that gaps were generated between the aluminum sheet and the organic EL panel. Thermal transfer from the organic EL panel to the first thermal conduction layer was interrupted by the gaps between the aluminum sheet and the organic EL panel. Consequently, a temperature rise, which was higher by "5° C." than that under the condition of the aluminum sheet, of which thickness ($t_2$) was "50 μm", was confirmed on the organic EL panel.

The present inventor also used a PDP (plasma display panel), of which thickness ($t_1$) was "4 mm", as the display panel to examine a contact state of the first thermal conduction layer with the display panel.

Most of the thickness of the PDP was a thickness of a glass substrate. Therefore, the Young's modulus ($E_1$) of the PDP was substantially regarded as the Young's modulus of high strain point glass, which was used for the glass substrate. Therefore, the value "77.5 GPa" was used for the Young's modulus of the PDP in order to calculate the ratio "a".

An aluminum sheet, of which thickness ($t_2$) was "80 μm", was used as the flexible portion. The Young's modulus ($E_2$) of the aluminum sheet was "70.3 GPa."

The ratio "a" obtained by using the aforementioned values, was "$3.63 \times 10^{-4}$".

In this case, the aluminum sheet was closely contacted with the PDP without gaps observed between the aluminum sheet and the PDP. Heat generated under light emission from the PDP was appropriately conducted to the thermal conduction plate through the aluminum sheet. It was confirmed that a temperature rise on a surface of the PDP was small in comparison with the condition under usage of a thick aluminum sheet (described below).

In order to compare with the aluminum sheet, which was "80 μm" in thickness ($t_2$), an aluminum sheet, of which thickness ($t_2$) was "0.8 mm", was prepared as the flexible portion. The ratio "a", which was calculated under this condition, was "$3.63 \times 10^{-2}$".

In this case, it was observed that gaps were generated between the aluminum sheet and the PDP. Thermal transfer from the PDP to the first thermal conduction layer was interrupted by the gaps between the aluminum sheet and the PDP. Consequently, a temperature rise, which was higher by "5° C." than that under the condition of the aluminum sheet, of which thickness ($t_2$) was "80 μm", was confirmed.

As the aforementioned examination shows that the first thermal conduction layer comes into a close contact with the display panel suitably if the ratio "a" of the rigidity of the flexible portion to the rigidity of the display panel is within a $10^{-4}$ to $10^{-3}$ range, so that a temperature rise of the display panel is suitably suppressed.

(Temperature Distribution)

The present inventor used simulation models to examine a temperature distribution of the display panel.

Figure 10:
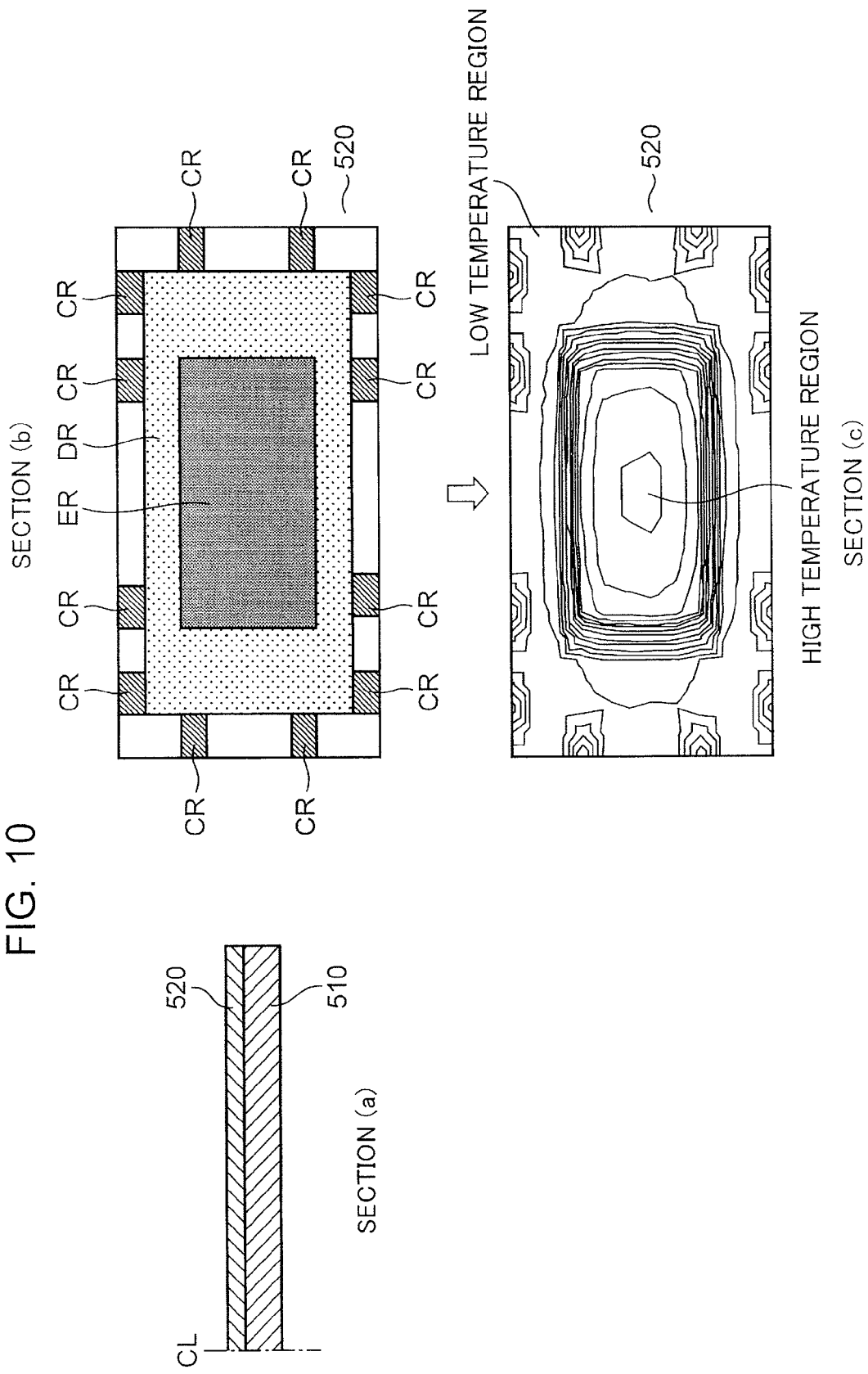
FIG. 10 shows a simulation result about a temperature distribution.
Figure 11:
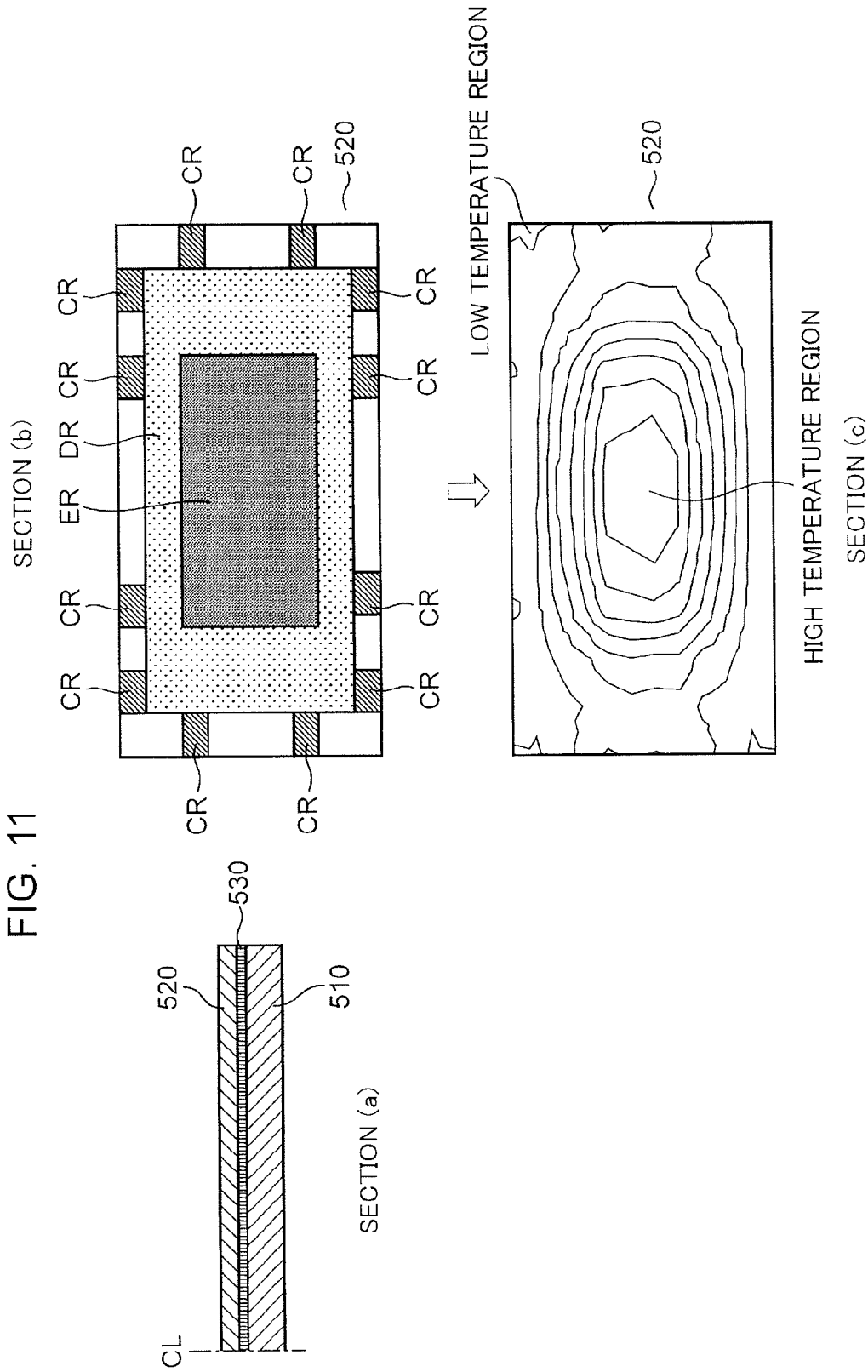
FIG. 11 shows a simulation result about a temperature distribution.

FIGS. 10 to 12 show a simulation result about a temperature distribution. The simulation result is described with reference to FIGS. 10 to 12.

Each of the sections (a) in FIGS. 10 to 12 is a schematic cross-sectional view of a modeled structure. The modeled structure is described with reference to each of the sections (a) in FIGS. 10 to 12.

The section (a) in FIG. 10 shows a structure including a heat sink 510 and a display panel 520 which is installed directly on the heat sink 510. The heat sink 510 is an aluminum plate which is 1 mm in thickness. Since the heat sink 510 is very rigid, an air layer is formed between the display panel 520 and the heat sink 510.

The section (a) in FIG. 11 shows not only the heat sink 510 and the display panel 520 shown in the section (a) in FIG. 10, but also a flexible portion 530 situated between the heat sink 510 and the display panel 520. The flexible portion 530 is closely contacted with the display panel 520 and the heat sink 510. Therefore, there is no air layer between the flexible portion 530 and the display panel 520 or between the flexible portion 530 and the heat sink 510. The flexible portion 530 is formed from a copper sheet.

The section (a) in FIG. 12 shows not only the heat sink 510, the display panel 520 and the flexible portion 530 shown in the section (a) in FIG. 11 but also a graphite sheet 540. A concave portion is formed in the center area of the graphite sheet 540. A flexible portion 530 is situated in this concave portion. The flexible portion 530 is surrounded by the display panel 520 and the graphite sheet 540. The graphite sheet 540 is in contact with the display panel 520 in the edge area. The flexible portion 530 is in contact with the display panel 520 in the center area. The structure shown in section (a) in FIG. 12 corresponds to the structure of the display device described in the context of the fourth embodiment.

Each of the sections (b) in FIGS. 10 to 12 is a schematic plan view of the display panel 520. Lighting conditions of the display panel 520 are described with reference to each of the sections (b) in FIGS. 10 to 12.

A lighting area ER and an unlit area DR surrounding the lighting area ER are shown in each of the sections (b) in FIGS. 10 to 12. The lighting area ER corresponds to the aforementioned center area. The unlit area DR corresponds to the aforementioned edge area. The display panel 520 generates heat mainly in the lighting area ER.

Several electrode leading portions CR, which are used for lighting the lighting area ER, are shown in an area outside the unlit area DR. The several electrode leading portions CR arranged at intervals so as to surround the unlit area DR also generates heat.

Each of the sections (c) in FIGS. 10 to 12 is an isothermal diagram acquired after simulation under the aforementioned conditions. Temperature distributions are described by using each of the sections (c) in FIGS. 10 to 12. As each of the sections (c) shows, isothermal lines in areas corresponding to the several electrode leading portions CR means high. In other words, a temperature of the areas corresponding to the electrode leading portions CR is high since the several electrode leading portions CR generate heat. These isothermal diagrams are indicated by the isothermal lines at "2° C." intervals.

As the section (c) in FIG. 10 shows, the structure shown in section (a) in FIG. 10 radiates little heat from the display panel 520 inappropriately. A high temperature region (higher by 27.5° C. than a low temperature region) is generated in the center area. This high temperature region causes problems, such as a drop in brightness of the display panel 520.

As each of the sections (c) in FIGS. 11 and 12 shows, the close contact of the flexible portion 530 with the display panel 520 suppresses a local temperature rise of the display panel 520 in the center area. The isothermal diagrams shown in the sections (c) in FIGS. 11 and 12 both indicate that the highest temperature was recorded in the center area, but the highest temperature reached is lower by about 10° C. than the highest temperature reached in the structure shown in FIG. 10.

In particular, the temperature of the high temperature region indicated in the section (c) in FIG. 11 is lower by 9.1° C. than the temperature of the high temperature region indicated in the section (c) in FIG. 10. The temperature of the high temperature region indicated in the section (c) in FIG. 12 is lower by 7.7° C. than the temperature of the high temperature region indicated in the section (c) in FIG. 10.

The aforementioned embodiments primarily include the following features. The display devices having the following features may suppress a drop in brightness caused by a local temperature rise in the center area of the display panel.

A display device according to one aspect of the aforementioned embodiments includes: a display panel configured to display images; a first thermal conduction layer including a flexible portion, which is compressively deformable and in contact with the display panel, and a thermal conduction portion configured to conduct heat from the flexible portion; and a second thermal conduction layer in contact with the thermal conduction portion. The first thermal conduction layer conducts heat isotropically. The second thermal conduction layer, which has higher thermal conduction characteristics in the in-plane direction than the first thermal conduction layer does, forms a thermal conduction element together with the thermal conduction portion. The thermal conduction element includes a first area corresponding to the center of the display panel and a second area which is closer to an edge of the display panel than the center area is. The second area has higher thermal conductivity in the in-plane direction than the first area does.

According to the aforementioned configuration, the flexible portion of the first thermal conduction layer is in contact with the display panel configured to display images and compressively deformed. Therefore, heat in the display panel is appropriately transferred to the flexible portion. The thermal conduction portion of the first thermal conduction layer conducts the heat from the flexible portion. The first thermal conduction layer conducts heat isotopically. The second thermal conduction layer in contact with the thermal conduction portion of the first thermal conduction layer has higher thermal conduction characteristics in the in-plane direction of the display panel than the first thermal conduction layer does.

The thermal conduction element, which is formed by the thermal conduction portion of the first thermal conduction layer and the second thermal conduction layer, includes a first area corresponding to the center of the display panel and a second area which is closer to an edge of the display panel than the center area is. Since the second area has higher thermal conductivity in the in-plane direction than the first area does, heat is more likely to be radiated from the second area, which is closer to the edge of the display panel than the center area is, than the first area in correspondence with the center of the display panel. Since a temperature in the second area drops, the heat in the first area is conducted to the second area. Consequently, a local temperature rise is less likely to happen to the center area of the display panel. Thus, brightness of the display device is less likely to drop.

In the aforementioned configuration, the first thermal conduction layer in the first area may be different in thickness from the first thermal conduction layer in the second area. The second thermal conduction layer in the first area may be different in thickness from the second thermal conduction layer in the second area.

According to the aforementioned configuration, the first thermal conduction layer in the first area may be different in thickness from the first thermal conduction layer in the second area. The second thermal conduction layer in the first area may be different in thickness from the second thermal conduction layer in the second area. Therefore, the second area may have higher thermal conductivity in the in-plane direction than the first area does due to thickness setting for the first and second thermal conduction layers. If the second area has higher thermal conductivity in the in-plane direction than the first area does, heat is more likely to be radiated from the second area, which is closer to an edge of the display panel than the center area is, than the first area in correspondence with the center of the display panel. Since there is a temperature drop in the second area, the heat in the first area is conducted to the second area. Consequently, a local temperature rise is less likely to happen to the center area of the display panel. Thus, brightness of the display device is less likely to drop.

In the aforementioned configuration, the first thermal conduction layer may become thinner in a direction from the first area to the second area. The second thermal conduction layer may become thicker in the direction from the first area to the second area.

According to the aforementioned configuration, the first thermal conduction layer may become thinner from the first area to the second area whereas the second thermal conduction layer becomes thicker from the first area to the second area. Therefore, the thermal conductivity of the second area may be set to be higher in the in-plane direction than the thermal conductivity of the first area may. If the second area has higher thermal conductivity in the in-plane direction than the first area does, heat is more likely to be radiated from the second area, which is closer to an edge of the display panel than the center area is, than the first area in correspondence with the center of the display panel. Since there is a temperature drop in the second area drops, heat in the first area is conducted to the second area. Consequently, a local temperature rise is less likely to happen to the center area of the display panel. Thus, brightness of the display device is less likely to drop.

In the aforementioned configuration, the flexible portion may be in contact with the display panel in the first area. The second thermal conduction layer in contact with the display panel may surround the first thermal conduction layer.

According to the aforementioned configuration, since the flexible portion is in contact with the display panel in the first area, heat from the center of the display panel is suitably transferred to the first thermal conduction layer. Since the second thermal conduction layer is in contact with the display panel in the second area, heat radiation from the second area may be facilitated. In addition, since the second thermal conduction layer surrounds the first thermal conduction layer, the radiation of the heat transferred to the first thermal conduction layer may also be facilitated. Consequently, a local temperature rise is less likely to happen to the center area of the display panel. Thus, brightness of the display device is less likely to drop.

In the aforementioned configuration, the second thermal conduction layer may be provided with a room to store the first thermal conduction layer.

According to the aforementioned configuration, since the second thermal conduction layer is provided with a room to store the first thermal conduction layer, the second thermal conduction layer appropriately surrounds the first thermal conduction layer to facilitate radiation of heat transferred to the first thermal conduction layer. Consequently, a local temperature rise is less likely to happen to the center area of the display panel. Thus, brightness of the display device is less likely to drop.

In the aforementioned configuration, the flexible portion situated in the room may be surrounded by the second thermal conduction layer and the display panel.

According to the aforementioned configuration, since the flexible portion is surrounded by the second thermal conduction layer and the display panel, heat is smoothly transferred from the display panel to the second thermal conduction layer.

In the aforementioned configuration, the second thermal conduction layer may be in contact with the display panel in the second area.

According to the aforementioned configuration, since the second thermal conduction layer is in contact with the display panel in the second area, heat is directly transferred from the display panel to the second thermal conduction layer.

In the aforementioned configuration, a thickness of the display panel may be $t_1$ and Young's modulus of the display panel may be $E_1$. A thickness of the flexible portion may be $t_2$. If Young's modulus of the flexible portion is $E_2$, a relationship expressed by $(t_2^2 \times E_2) < (t_1^2 \times E_1)$ may be satisfied.

According to the aforementioned configuration, when the thickness of the display panel is $t_1$, the Young's modulus of the display panel is $E_1$, the thickness of the flexible portion is $t_2$, and the Young's modulus of the flexible portion is $E_2$, the relationship expressed by $(t_2^2 \times E_2) < (t_1^2 \times E_1)$ is satisfied. Consequently, the flexible portion is compressed rather than the display panel. Therefore, the first thermal conduction layer may be closely contacted with the display panel to efficiently conduct heat in the display panel.

In the aforementioned configuration, a thickness of the display panel may be $t_1$. Young's modulus of the display panel may be $E_1$. A thickness of the flexible portion may be $t_2$. If Young's modulus of the flexible portion is $E_2$, a ratio "a" expressed by $(t_2^2 \times E_2)/(t_1^2 \times E_1)$ may be in a $10^{-4}$ to $10^{-3}$ range.

According to the aforementioned configuration, when the thickness of the display panel is $t_1$, the Young's modulus of the display panel is $E_1$, the thickness of the flexible portion is $t_2$, and the Young's modulus of the flexible portion is $E_2$, the ratio "a" expressed by $(t_2^2 \times E_2)/(t_1^2 \times E_1)$ is in a $10^{-4}$ to $10^{-3}$ range. Consequently, the flexible portion is compressed rather than the display panel. Therefore, the first thermal conduction layer may be closely contacted with the display panel to efficiently conduct heat in the display panel.

In the aforementioned configuration, the flexible portion may include needles standing from the thermal conduction portion to the display panel.

According to the aforementioned configuration, since the flexible portion includes the needles standing from the thermal conduction portion to the display panel, the first thermal conduction layer may be closely contacted with the display panel to efficiently conduct heat in the display panel.

In the aforementioned configuration, the flexible portion may be formed from porous metal.

According to the aforementioned configuration, since the flexible portion is formed from the porous metal, the first thermal conduction layer may be closely contacted with the display panel to efficiently conduct heat in the display panel.

In the aforementioned configuration, the flexible portion may be formed from soft metal mesh.

According to the aforementioned configuration, since the flexible portion is formed from the soft metal mesh, the first thermal conduction layer may be closely contacted with the display panel to efficiently conduct heat in the display panel.

In the aforementioned configuration, the second thermal conduction layer may be formed from a graphite sheet.

According to the aforementioned configuration, since the second thermal conduction layer is formed from the graphite sheet, thermal conduction may be appropriately facilitated in the in-plane direction.

In the aforementioned configuration, the display device may further include a compressing element configured to compress the flexible portion. The compressing element may include a heat sink in contact with the second thermal conduction layer, and a spring element configured to clamp the heat sink and the display panel.

According to the aforementioned configuration, since the display device further includes the compressing element configured to compress the flexible portion, the flexible portion comes into close contact with the display panel suitably. Since the compressing element includes the heat sink in contact with the second thermal conduction layer and a spring element configured to clamp the heat sink and the display panel, heat conducted to the second thermal conduction layer is radiated from the display panel through the heat sink.

INDUSTRIAL APPLICABILITY

The present invention may be suitably applied to display devices configured to display images.

The invention claimed is:

1. A display device, comprising:
a display panel configured to display images;
a first thermal conduction layer including a flexible portion, which is compressively deformable, and a thermal conduction portion configured to conduct heat from the flexible portion, the flexible portion being in contact with the display panel; and
a second thermal conduction layer in contact with the thermal conduction portion, wherein
the first thermal conduction layer conducts heat isotropically,
the second thermal conduction layer, which has higher thermal conduction characteristics in an in-plane direction than the first thermal conduction layer does, forms a thermal conduction element together with the thermal conduction portion,
the thermal conduction element includes a first area corresponding to a center of the display panel and a second area which is closer to an edge of the display panel than the first area is, and
the second area has higher thermal conductivity in the in-plane direction than the first area does.

2. The display device according to claim 1, wherein
the first thermal conduction layer in the first area is different in thickness from the first thermal conduction layer in the second area, and
the second thermal conduction layer in the first area is different in thickness from the second thermal conduction layer in the second area.

3. The display device according to claim 2, wherein
the first thermal conduction layer becomes thinner in a direction from the first area to the second area, and
the second thermal conduction layer becomes thicker in the direction from the first area to the second area.

4. The display device according to claim 1, wherein
the flexible portion is in contact with the display panel in the first area, and
the second thermal conduction layer in contact with the display panel surrounds the first thermal conduction layer.

5. The display device according to claim 4, wherein
the second thermal conduction layer is provided with a room to store the first thermal conduction layer.

6. The display device according to claim 5, wherein
the flexible portion situated in the room is surrounded by the second thermal conduction layer and the display panel.

7. The display device according to claim 5, wherein
the second thermal conduction layer is in contact with the display panel in the second area.

8. The display device according to claim 1, wherein
when a thickness of the display panel is $t_1$, a Young's modulus of the display panel is $E_1$, a thickness of the flexible portion is $t_2$, and a Young's modulus of the flexible portion is $E_2$,
$(t_2^2 \times E_2) < (t_1^2 \times E_1)$ is satisfied.

9. The display device according to claim 1, wherein
when a thickness of the display panel is $t_1$, a Young's modulus of the display panel is $E_1$, a thickness of the flexible portion is $t_2$, and a Young's modulus of the flexible portion is $E_2$,
a ratio "a" expressed by $(t_2^2 \times E_2)/(t_1^2 \times E_1)$ is in a range of $10^{-4}$ to $10^{-3}$.

10. The display device according to claim 1, wherein
the flexible portion includes needles standing from the thermal conduction portion to the display panel.

11. The display device according to claim 1, wherein
the flexible portion is formed from porous metal.

12. The display device according to claim 1, wherein
the flexible portion is formed from soft metal mesh.

13. The display device according to claim 1, wherein
the second thermal conduction layer is formed from a graphite sheet.

14. The display device according to claim 1, further comprising a compressing element configured to compress the flexible portion, wherein
the compressing element includes a heat sink in contact with the second thermal conduction layer, and a spring element configured to clamp the heat sink and the display panel.

* * * * *